(12) United States Patent
Cai et al.

(10) Patent No.: US 10,619,801 B2
(45) Date of Patent: Apr. 14, 2020

(54) LIGHTING APPARATUS

(71) Applicant: GE LIGHTING SOLUTIONS, LLC, East Cleveland, OH (US)

(72) Inventors: Dengke Cai, East Cleveland, OH (US); Thomas J. Boyle, East Cleveland, OH (US); Jian Li, Shanghai (CN); Qing Yi, Shanghai (CN); Zhiyong Wang, Shanghai (CN); Huisheng Zhou, Shanghai (CN); Kun Xiao, Shanghai (CN); Ruojian Zhu, Shanghai (CN)

(73) Assignee: Consumer Lighting (U.S.), LLC, Norwalk, CT (US)

( * ) Notice: Subject to any disclaimer, the term of this patent is extended or adjusted under 35 U.S.C. 154(b) by 263 days.

(21) Appl. No.: 15/529,849

(22) PCT Filed: Dec. 1, 2015

(86) PCT No.: PCT/US2015/063087
§ 371 (c)(1),
(2) Date: May 25, 2017

(87) PCT Pub. No.: WO2016/089810
PCT Pub. Date: Jun. 9, 2016

(65) Prior Publication Data
US 2017/0261162 A1  Sep. 14, 2017

(30) Foreign Application Priority Data

Dec. 4, 2014  (CN) .................. 2014 1 01736040

(51) Int. Cl.
*F21K 9/64* (2016.01)
*F21K 9/232* (2016.01)
(Continued)

(52) U.S. Cl.
CPC ............. *F21K 9/64* (2016.08); *F21K 9/232* (2016.08); *F21Y 2105/18* (2016.08); *F21Y 2115/10* (2016.08); *H01L 33/44* (2013.01)

(58) Field of Classification Search
CPC ... F21K 9/64; F21K 9/232; F21K 9/65; F21K 9/00; F21K 99/00; F21K 9/60; F21K 9/20;
(Continued)

(56) References Cited

U.S. PATENT DOCUMENTS 4,441,046 A * 4/1984 James .................. H01K 1/32
313/112
5,083,252 A   1/1992 McGuire
(Continued)

FOREIGN PATENT DOCUMENTS

CN       1360544 A     7/2002
CN     102782396 A    11/2012
(Continued)

OTHER PUBLICATIONS

Li, M., et al., "Controllable energy transfer in fluorescence upconversion of NdF3 and NaNdF4 nanocrystal," Optics Express, vol. 18, No. 4, pp. 3364-3369 (Feb. 15, 2010).
(Continued)

*Primary Examiner* — Bao Q Truong
(74) *Attorney, Agent, or Firm* — Wood IP LLC

(57) ABSTRACT

A lighting apparatus includes at least one light source generating a visible light and an optical component, the optical component includes a transparent, translucent or reflective substrate and a coating on a surface of the substrate to cause a color filtering effect to the visible light passing through the optical component, the coating includes a compound containing Nd3+ ions and F" ions.

17 Claims, 7 Drawing Sheets

(51) Int. Cl.
　　　*F21Y 115/10*　　　(2016.01)
　　　*F21Y 105/18*　　　(2016.01)
　　　*H01L 33/44*　　　(2010.01)

(58) Field of Classification Search
　　　CPC .. F21Y 2105/18; F21Y 2115/10; H01L 33/44;
　　　　　　F21S 2/00; F21V 19/042; F21V 19/045;
　　　　　　F21V 1/17; F21V 3/12; F21V 9/30; F21V
　　　　　　　　　　　　　　　　　　　5/10; F21V 9/32
　　　See application file for complete search history.

(56) References Cited

U.S. PATENT DOCUMENTS

| | | | |
|---|---|---|---|
| 5,252,887 A * | 10/1993 | Reisman | H01J 61/40 |
| | | | 313/110 |
| 6,749,777 B2 | 6/2004 | Argoitia et al. | |
| 7,583,443 B2 | 9/2009 | Zaczek | |
| 8,459,814 B2 | 6/2013 | Su et al. | |
| 2004/0125459 A1 | 7/2004 | Tanitsu et al. | |
| 2010/0149510 A1 | 6/2010 | Zaczek et al. | |
| 2010/0277887 A1 | 11/2010 | Su et al. | |
| 2012/0230032 A1 | 9/2012 | Sumiya et al. | |
| 2014/0191653 A1 * | 7/2014 | Edmond | H05B 33/22 |
| | | | 313/512 |
| 2014/0268794 A1 | 9/2014 | Donofrio et al. | |
| 2017/0261181 A1 * | 9/2017 | Cai | F21V 3/0625 |

FOREIGN PATENT DOCUMENTS

| | | |
|---|---|---|
| JP | H04-194803 A | 7/1992 |
| WO | 2016/054764 A1 | 4/2016 |

OTHER PUBLICATIONS

International Search Report and Written Opinion issued in connection with corresponding PCT Application No. PCT/US2015/63087 dated Mar. 8, 2016.

International Preliminary Report on Patentability issued in connection with corresponding PCT Application No. PCT/US2015/63087 dated Jun. 6, 2017.

First Office Action and Search issued in connection with corresponding CN Application No. 201410736040.2 dated Aug. 3, 2017.

* cited by examiner

--Prior Art--

LIGHTING APPARATUS

BACKGROUND

Embodiments of the invention relate generally to lighting apparatuses and related technologies. More particularly, embodiments of the invention relate to a light apparatus having an optical component with coating materials for imparting a color filtering effect to light sources.

LED lamps provide a variety of advantages over traditional incandescent and fluorescent lamps, including but not limited to a longer life expectancy, higher energy efficiency, and full brightness without requiring time to warm up. As known in the art, LEDs (which as used herein also encompasses organic LEDs, OLEDs and the like) are solid-state semiconductor devices that convert electrical energy into electromagnetic radiation which includes visible light (wavelengths of about 400 to 750 nm). An LED typically includes a chip (die) of a semiconducting material doped with impurities to create a p-n junction. The LED chip is electrically connected to an anode and cathode, all of which are often mounted within a package. In comparison to other lamps such as incandescent or fluorescent lamps, LEDs emit visible light is more directional in a narrower beam.

FIG. 1 is a perspective view of a conventional LED-based lighting apparatus 10 suitable for area lighting applications. The lighting apparatus (which may also be referred to as a "lighting unit" or "lamp") 10 includes a transparent or translucent cover or enclosure 12, a threaded base connector 14, and a housing or base 16 between the enclosure 12 and the connector 14.

An LED-based light source (not shown) which is an LED array including multiple LED devices, is located at the lower end of the enclosure 12 and adjacent the base 16. Because LED devices emit visible light in narrow bands of wavelengths, for example, green, blue, red, etc., combinations of different LED devices are often combined in LED lamps to produce various light colors, including white light. Alternatively, light that appears substantially white may be generated by a combination of light from a blue LED and a phosphor (e.g., YAG:Ce) that converts at least some of the blue light of the blue LED to a different color; the combination of the converted light and the blue light can generate light that appears white or substantially white. The LED devices are mounted on a carrier mounted to or within the base 16, and the LED devices are encapsulated on the carrier with a protective cover which formed of an index-matching material to enhance the efficiency of visible light extraction from the LED devices.

To promote the capability of the lighting apparatus 10 to emit visible light in a nearly omnidirectional manner, the enclosure 12 shown in FIG. 1 is substantially spheroidal or ellipsoidal in shape. To further promote a near omnidirectional lighting capability, the enclosure 12 is formed of a material that enables the enclosure 12 to function as an optical diffuser. Materials employed to produce the diffuser include polyamides (e.g., nylon), polycarbonate (PC), or polypropylene (PP); or the like. These polymeric materials also include $SiO_2$ to promote refraction of the light and thereby achieve a white reflective appearance. The inner surface of the enclosure 12 may be provided with a coating (not shown) that contains a phosphor composition.

FIG. 2 is a graph from a publication: "Controllable Energy Transfer in Fluorescence Upconversion of $NdF_3$ and $NaNdF_4$ Nanocrystals", Li et al., Optics Express, Vol. 18 Issue 4, pp. 3364-3369 (2010). The graph shows optical properties for $NdF_3$ and $NaNdF_4$ nanocrystals dispersed in water at the same molar concentration of 180 mM. FIG. 2 shows absorption spectra observed for the $NdF_3$ and $NaNdF_4$ nanocrystals. Absorption peaks of $NdF_3$ and $NaNdF_4$ were 578 and 583 nm, respectively, and therefore well within the yellow light wavelength range (about 560 to about 600 nm (nanometer)).

Though the use of combinations of different LED devices and/or phosphors can be utilized to promote the ability of LED lamps to produce a white light effect, other approaches are desirable as alternatives or in addition thereto.

BRIEF DESCRIPTION

Embodiments of the invention disclose a lighting apparatus including an Nd—F and/or Nd—X—F compound coating to cause a color filtering effect.

In accordance with one embodiment disclosed herein, a lighting apparatus includes at least one light source generating a visible light and an optical component, the optical component includes a transparent, translucent or reflective substrate and a coating on a surface of the substrate to cause a color filtering effect to the visible light passing through the optical component, the coating includes a compound containing $Nd^{3+}$ ions and $F^-$ ions.

In one embodiment, the coating including an Nd—F and/or Nd—X—F compound is configured to coat on the surface of the substrate with a simple way. By filtering yellow light wavelengths through the use of the coating including Nd—F and/or Nd—X—F compounds, light emitted by at least one light source can be adjusted to achieve an enhanced color rendering effect.

BRIEF DESCRIPTION OF THE DRAWINGS

These and other features and aspects of the present disclosure will become better understood when the following detailed description is read with reference to the accompanying drawings in which like characters represent like parts throughout the drawings, wherein.

DETAILED DESCRIPTION

Figure 1:
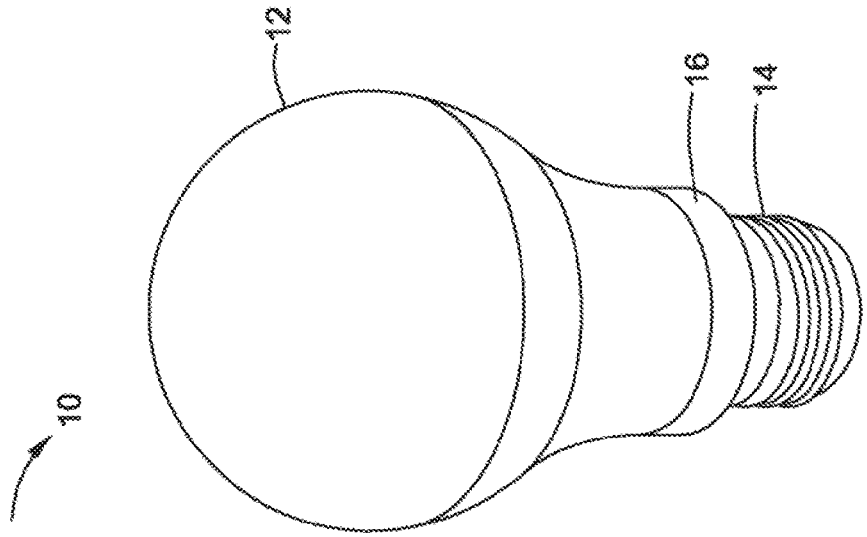
FIG. 1 is a perspective view of a conventional LED-based lighting apparatus.
Figure 2:
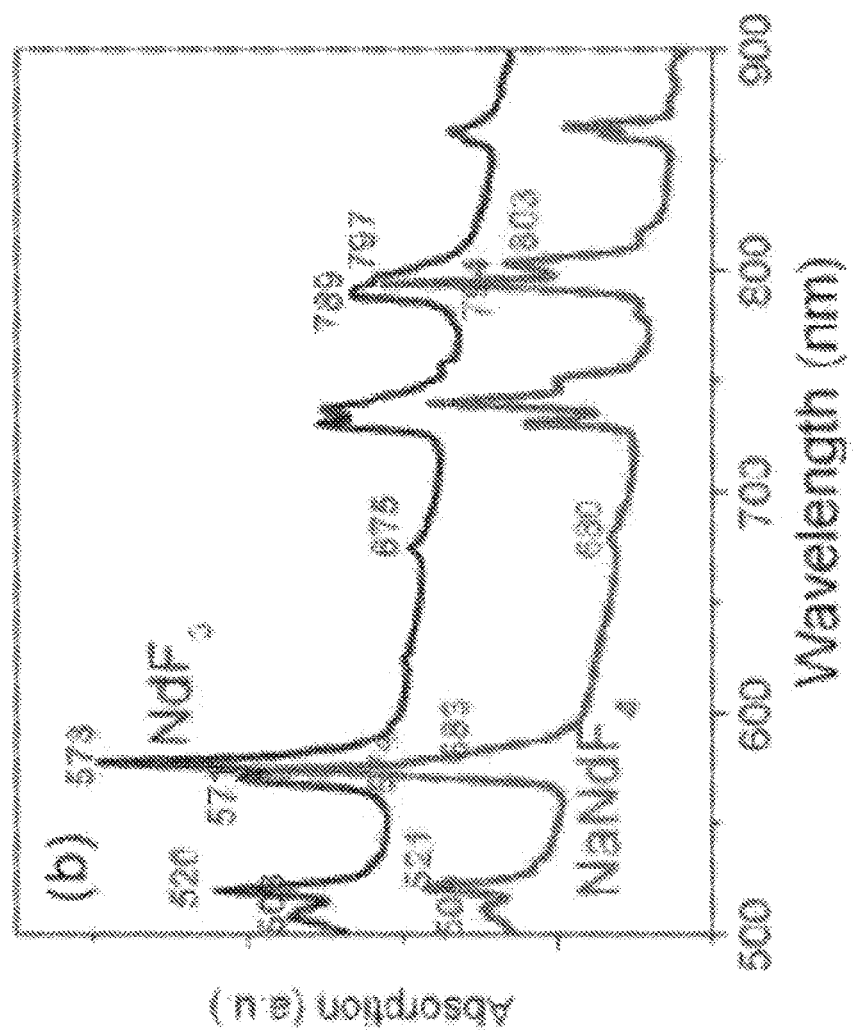
FIG. 2 shows absorption spectra of $NdF_3$ and $NaNdF_4$ nanocrystals dispersed in water with the same molar concentration of 180 mM, which is originated from a printed publication.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are employed to distinguish one element from another. Also, the terms "a" and "an" do not denote a limitation of quantity, but rather denote the presence of at least one of the referenced items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect.

Embodiments of the present invention provide coating materials of lighting apparatuses suitable for using to impart a color filtering effect to a visible light generated by at least one light source, a particular example being the visible light generated by an LED. As used herein, an optical component includes a transparent, translucent or a reflective substrate and a coating on a surface of the substrate to cause the color filtering effect to the visible light passing through the optical component, in particular to filter the visible light in the yellow light wavelength range, for example, wavelengths from about 560 nm to about 600 nm. The coating includes a compound containing $Nd^{3-}$ ions and $F^-$ ions.

In one embodiment, the compound using in the coating including $Nd^{3+}$ ions and $F^-$ ions may be an Nd—F compound or an Nd—X—F compound. As used herein, the "Nd—F compound" should be broadly construed to include compounds including neodymium and fluoride and optionally other elements. Such compounds comprising neodymium and fluoride may comprise neodymium fluoride, or neodymium oxyfluoride (e.g., $NdO_xF_y$, where 2x+y=3), or neodymium fluoride comprising adventitous water and/or oxygen, or a neodymium hydroxide fluoride (e.g., $Nd(OH)_aF_b$, where a+b=3), or numerous other compounds comprising neodymium and fluoride which will be become readily apparent from the following description. In some embodiments, the compound is $NdF_3$ or NdFO. For the Nd—X—F compound, X is at least one element selected from the group consisting of: elements that form compounds with neodymium, such as, oxygen, nitrogen, sulfur and chlorine, or at least one metallic element that form compounds with fluorine, such as Na, K, Al, Mg, Li, Ca, Sr, Ba, and Y, or combinations of such elements, said metallic elements being different from neodymium. Particular examples of Nd—X—F compounds may include: neodymium oxyfluoride (Nd—O—F) compounds; Nd—X—F compounds in which X may be Mg and Ca or may be Mg, Ca and O; as well as other compounds containing Nd—F, including perovskite structures doped with neodymium. Certain Nd—X—F compounds may enable broader absorption at wavelengths of about 580 nm.

In one embodiment, the transparent or translucent substrate of the optical component is a diffuser, such as a bulb, a lens and an envelope enclosing at least one LED chip. In another embodiment, the substrate is a reflective substrate, and the LED chip is arranged outside of the substrate. The Nd—F and/or Nd—X—F compound coating is coated on the surface of the substrate, and the thickness of the coating should be sufficient to achieve the color filtering effect. This may typically be between 50 nm to 1000 um, with a preferred thickness being between 100 nm to 500 um.

Below are several embodiments of lighting apparatus using the coating containing the Nd—F and/or Nd—X—F compound to cause a color filter effect, but not limited herein.

Figure 3:
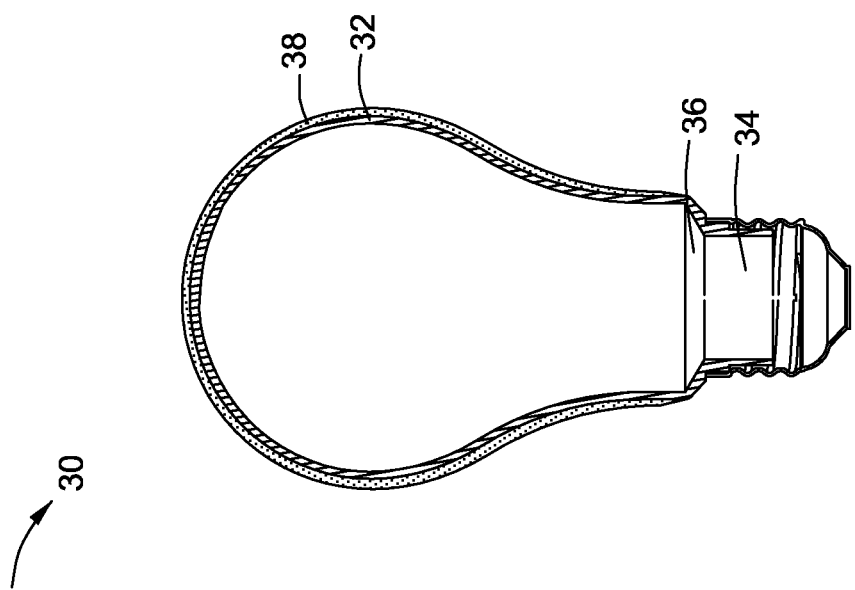
FIG. 3 is a cross-sectional view of an LED-based lighting apparatus in accordance with a first embodiment of the present invention.

FIG. 3 is an LED-based lighting apparatus suitable for area lighting applications in accordance with a first embodiment of the present invention. The LED-based lighting apparatus (which may also be referred to as a "lighting unit" or "lamp") is an LED lamp 30 configured to provide a nearly omnidirectional lighting capability. In other embodiments, the LED lamp 30 is an incandescent or fluorescent lamp. As shown in FIG. 3, the LED lamp 30 includes a bulb 32, a connector 34, a base 36 between the bulb 32 and the connector 34, and a coating 38 on an outer surface of the bulb 32. The coating 38 includes the Nd—F and/or Nd—X—F compound. In other embodiments, the bulb 32 can be replaced by other transparent or translucent substrates. In one embodiment, the coating 38 is coated on an inner surface of the bulb 32.

Figure 4:
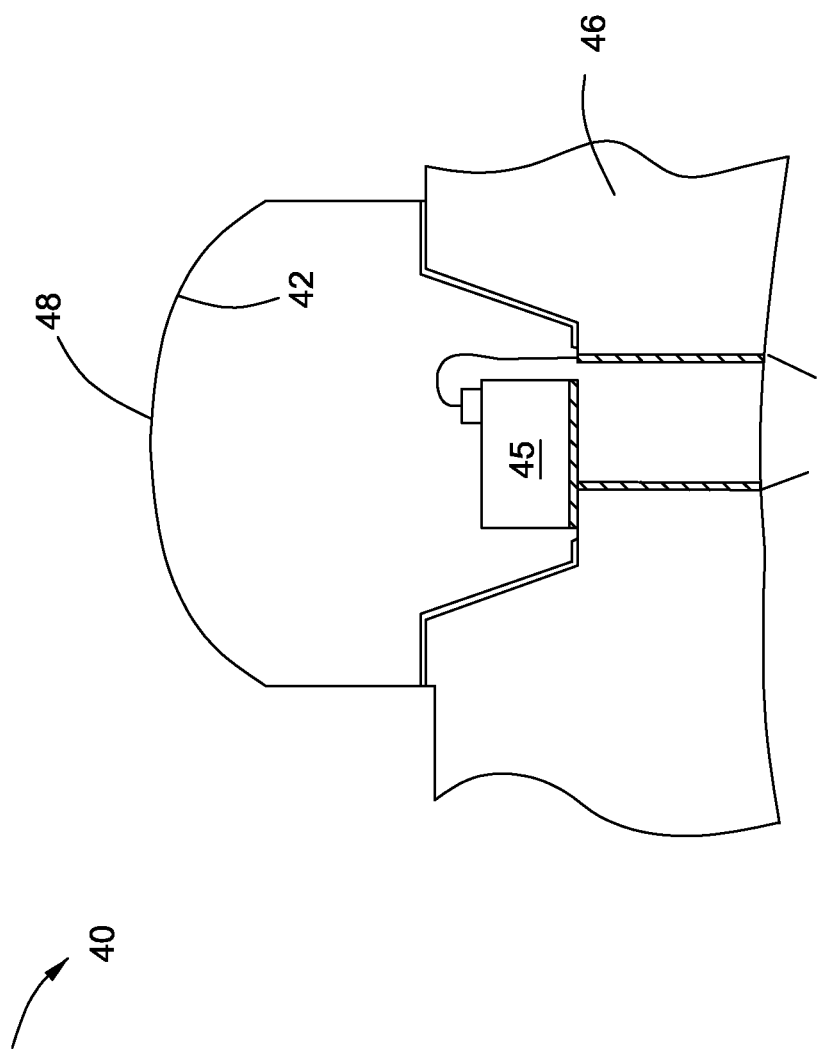
FIG. 4 is a cross-sectional view of an LED-based lighting apparatus in accordance with a second embodiment of the present invention.

FIG. 4 is an LED-based lighting apparatus 40 in accordance with a second embodiment of the present invention. The LED-based lighting apparatus 40 includes a dome 42 that serves as an optically transparent or translucent substrate enclosing an LED chip 45 mounted on a printed circuit board (PCB) 46. A phosphor may also be used to emit light of color other than what is generated by an LED chip 45. For this purpose, an inner surface of the dome 42 may be provided with a phosphor composition coating (not shown), in which case electromagnetic radiation (for example, blue visible light, ultraviolet (UV) radiation, or near-visible ultraviolet (NUV) radiation) emitted by the LED chip 45 can be absorbed by the phosphor composition coating, resulting in excitation of the phosphor composition to produce visible light that is emitted through the dome 42. A coating 48 including the Nd—F and/or Nd—X—F compound is used to cause the color filtering effect to the visible light generated by the LED chip 45 passing through the dome 42, and the coating 48 is coated on an outer surface of the dome 42. In other embodiments, the dome 42 can be the optically transparent or translucent substrate with kinds of shapes, such as flat and groove. In one embodiment, the coating 48 is coated on the inner surface of the dome 42.

Figure 5:
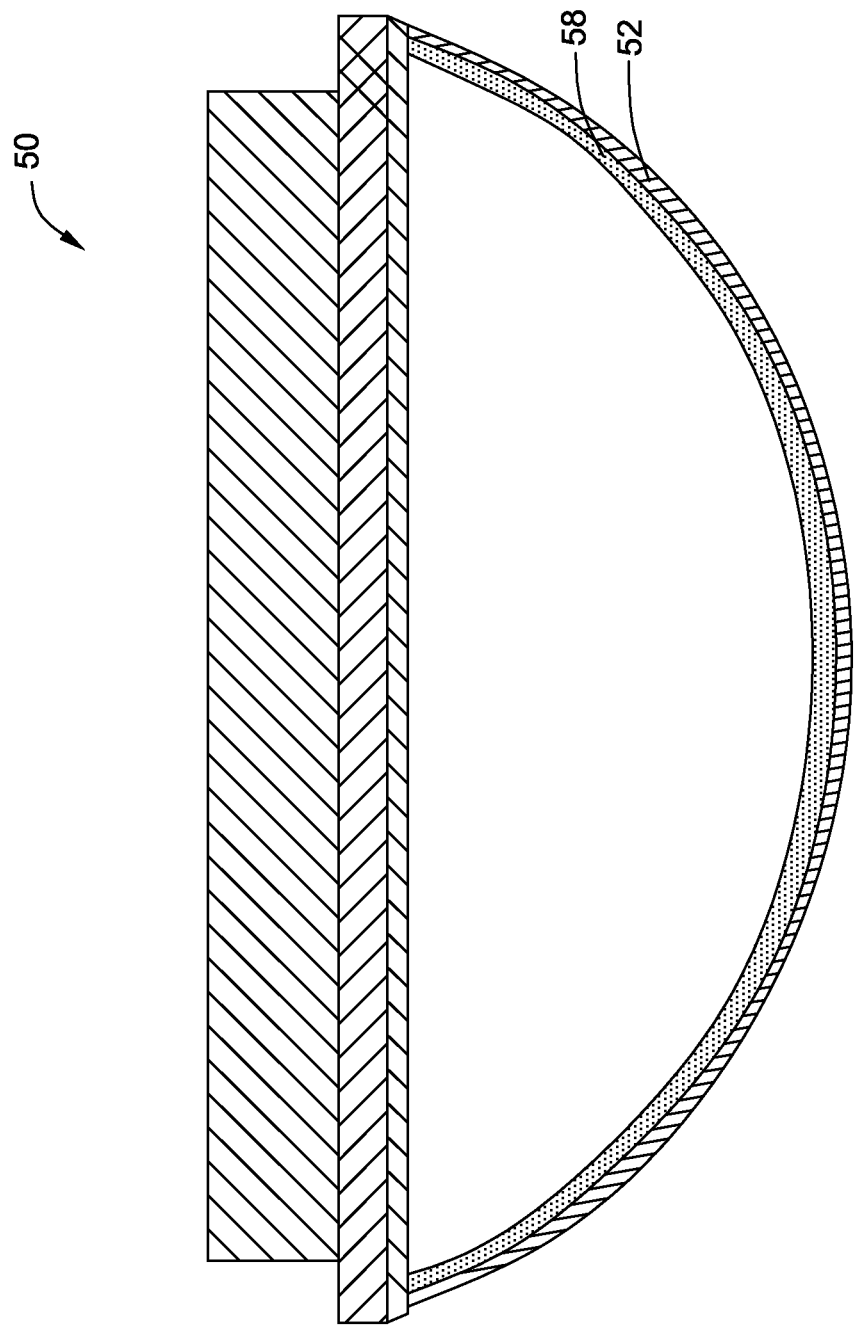
FIG. 5 is a cross-sectional view of an LED-based lighting apparatus in accordance with a third embodiment of the present invention.

FIG. 5 is an LED-based lighting apparatus in accordance with a third embodiment of the present invention. As shown in FIG. 5, the LED-based lighting apparatus is a ceiling lamp 50, the ceiling lamp 50 includes a hemispherical substrate 52 and a coating 58 containing the Nd—F and/or Nd—X—F compound, the coating 58 is on an inner surface of the hemispherical substrate 52.

Figure 6:
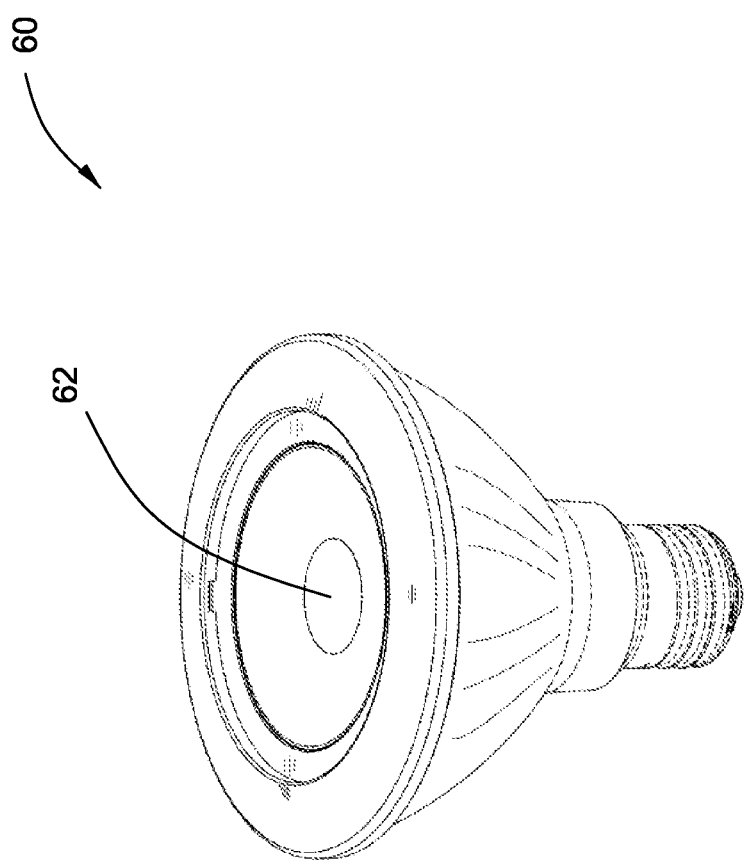
FIG. 6 is a perspective view of an LED-based lighting apparatus in accordance with a fourth embodiment of the present invention.

FIG. 6 is an LED-based lighting apparatus in accordance with a fourth embodiment of the present invention. As shown in FIG. 6, the LED-based lighting apparatus is a lens 60, and the lens 60 includes a flat substrate 62. In certain embodiments, the flat substrate 62 includes Nd—F and/or Nd—X—F compound coating (not shown) on an outer surface thereof.

Figure 7:
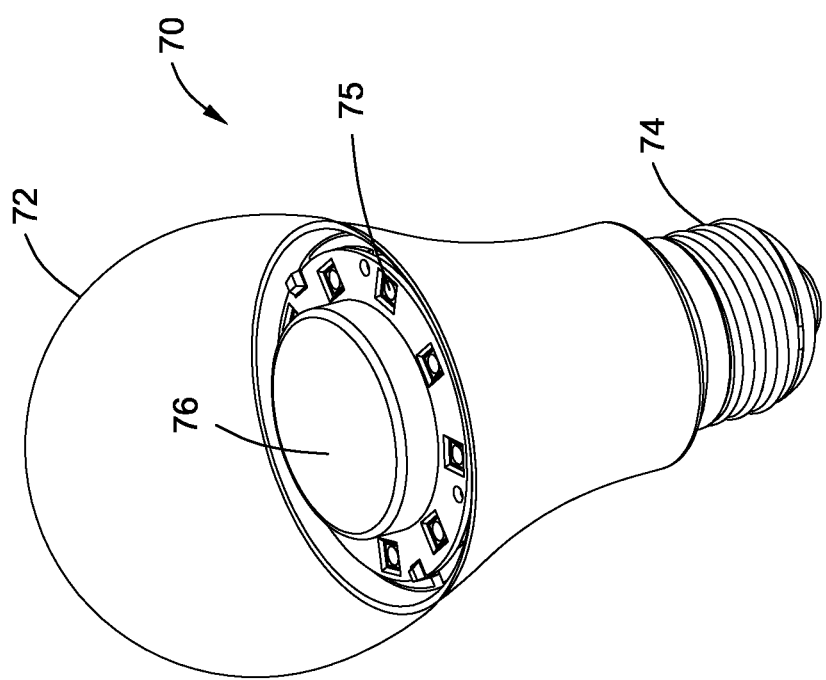
FIG. 7 is a perspective view of an LED-based lighting apparatus in accordance with a fifth embodiment of the present invention.

FIG. 7 is an LED-based lighting apparatus 70 in accordance with a fifth embodiment of the present invention. The LED-based lighting apparatus 70 includes a bulb 72, at least one LED chip 75 and a reflective substrate 76. The reflective substrate 76 is configured to reflect the visible light generated by the LED chip 75. In certain embodiments, the reflective substrate 76 includes Nd—F and/or NdX—F compound coating (not shown) on an outer surface thereof.

In one embodiment, such coating materials (including compound containing Nd3+ ions and F— ions) of light apparatus may have little if any optical scattering (diffusion) effect; or, alternatively, may cause considerable optical scattering on light passing therethrough. To increase a scattering angle, the coating includes discrete particles of an organic or inorganic material. Alternatively, the organic or inorganic material can be solely made up of discrete particles of the Nd—F and/or Nd—X—F compound (e.g., formed partially or entirely of the Nd—F and/or Nd—X—F compound) and/or made up of a mixture of discrete particles of the Nd—F and/or Nd—X—F compound (e.g., formed partially or entirely of the Nd—F and/or Nd—X—F compound) and particles formed of at least one other different material.

In one embodiment, a suitable particle size for the organic or inorganic material is from about 1 nm to about 10 um. For the LED lamp 30 as shown in FIG. 3, in order to maximize a scattering angle so that the LED lamp 30 could achieve omni-directional lighting. The particle size may be much less than 300 nm to general a Rayleigh scattering.

Although not intended to be limiting, the Nd—F and/or Nd—X—F compound coating may be applied by, for example, spray coating, roller coating, meniscus or dip coating, stamping, screening, dispensing, rolling, brushing or spraying or any other method that can provide a coating of even thickness. The following may detailed describe how to coat the Nd—F and/or Nd—X—F compound coating on the substrate.

Hereinafter, three embodiments of coating method will be illustrated with examples.

In one embodiment, as shown in FIG. 3, the coating 38 is coated on the bulb 32 by a bonding method. The LED lamp 30 further includes a bonding layer (not shown) between the bulb 32 and the coating 38, and the bonding layer includes an organic adhesive or an inorganic adhesive. The organic adhesive includes an epoxy resin, an organic silicon adhesive, an acrylic resin and etc. The inorganic adhesive includes a silicate inorganic adhesive, a sulfate adhesive, a phosphate adhesive, an oxide adhesive, a boric acid salt adhesive and etc.

In one embodiment, as shown in FIG. 3, the coating 38 is coated on the outer surface of the bulb 32 by a spray coating method. Firstly, a liquid mixture containing NdFO and/or $NdF_3$ compounds, silicon dioxide, dispersant such as Dispex A40, water and optionally $TiO_2$ or $Al_2O_3$ is performed. Subsequently, the liquid mixture performed is sprayed to the bulb 32. Finally, the bulb 32 is cured to obtain the coated LED lamp 30.

In one embodiment, as shown in FIG. 3, the coating 38 is coated on the outer surface of the bulb 32 by an electrostatic coating method. Firstly, electrically charged powder consisting NdFO and/or $NdF_3$ compounds, $SiO_2$ and $Al_2O_3$ is performed. Subsequently, the powder is coated to the bulb 32 which is oppositely charged.

In certain embodiments of the present invention, both the spray coating method and the electrostatic coating method use materials without organic solvent or organic compound, it can extend the service life of the light apparatus and avoid the discoloration caused by sulfonation.

In one embodiment, weight percentage of $NdF_3$ or another $Nd^{3+}$ ion source (as examples, Nd—F compounds and Nd—X—F compounds) in the coating is between 1% to about 20%. In one specific embodiment, weight percentage of $NdF_3$ or another $Nd^{3+}$ ion source in the coating is between 1% to about 10. In certain embodiments, to promote refraction of the light and thereby achieve a white reflective appearance, the coating further includes an additive having a higher refractive index relative to the Nd—F and/or Nd—X—F compound. The additive is selected from at least one of metal oxides or non-metal oxides, such as $TiO_2$, $SiO_2$ and $Al_2O_3$.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

While embodiments of the invention have been described herein, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed for carrying out this invention, but that the invention will include all embodiments falling within the scope of the appended claims.

Furthermore, the skilled artisan will recognize the interchangeability of various features from different embodiments. The various features described, as well as other known equivalents for each feature, can be mixed and matched by one of ordinary skill in this art to construct additional systems and techniques in accordance with principles of this disclosure.

The invention claimed is:

1. A lighting apparatus comprising at least one light source generating a visible light and an optical component, the optical component comprising a transparent, translucent or reflective substrate and a coating on a surface of the substrate to cause a color filtering effect to the visible light passing through the optical component, the coating comprising a compound containing $Nd^{3+}$ ions and $F^-$ ions;

wherein the compound is an Nd—X—F compound, X comprising at least one element selected from the group consisting of: elements that form compounds with neodymium, and metallic elements that form compounds with fluorine, said metallic elements being different from neodymium.

2. The lighting apparatus according to claim 1, wherein the light source is an LED.

3. The lighting apparatus according to claim 1, wherein the compound is NdFO.

4. The lighting apparatus according to claim 1, wherein the compound comprises discrete particles of an organic or inorganic material, particle size of the organic or inorganic material is from about 1 nm to about 10 μm.

5. The lighting apparatus according to claim 1, wherein a weight percentage of the compound in the coating is from about 1% to about 20%.

6. The lighting apparatus according to claim 5, wherein a weight percentage of the compound in the coating is from about 1% to about 10%.

7. The lighting apparatus according to claim 1, wherein a thickness of the coating is from about 50 nm to about 1000 micrometer.

8. The lighting apparatus according to claim 1, wherein the coating further comprises an additive having a higher refractive index than the compound, and wherein the additive is selected from metal oxides or non-metal oxides.

9. The lighting apparatus according to claim 8, wherein the additive is selected from the group consisting of $TiO_2$, $SiO_2$ and $Al_2O_3$.

10. The lighting apparatus according to claim 1, wherein the coating is coated on the outside or inside surface of the substrate.

11. The lighting apparatus according to claim 1, wherein the substrate is a diffuser, the diffuser is selected from a bulb, a lens, or an envelope enclosing the LED.

12. The lighting apparatus according to claim 1, wherein the reflective substrate is configured to reflect the visible light generated by the light source.

13. The lighting apparatus according to claim 12, wherein the at least one light source is arranged around the reflective substrate.

14. The lighting apparatus according to claim 1, wherein shape of the substrate is flat or curved.

15. The lighting apparatus according to claim 1, wherein the optical component further comprises an organic adhesive or an inorganic adhesive.

16. The lighting apparatus according to claim 1, wherein the coating is coated on the surface of the substrate by a spray coating method.

17. The lighting apparatus according to claim 1, wherein the coating is coated on the surface of the substrate by an electrostatic coating method.

* * * * *